(12) United States Patent
Wortel et al.

(10) Patent No.: US 10,013,013 B1
(45) Date of Patent: Jul. 3, 2018

(54) BANDGAP VOLTAGE REFERENCE

(71) Applicant: NXP B.V., Eindhoven (NL)

(72) Inventors: Klaas Wortel, Eindhoven (NL); Jan Inghels, Eindhoven (NL); Henri Verhoeven, Someren (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/715,519

(22) Filed: Sep. 26, 2017

(51) Int. Cl.
*G05F 3/30* (2006.01)
*G05F 3/10* (2006.01)
*H03K 5/003* (2006.01)

(52) U.S. Cl.
CPC ............. *G05F 3/10* (2013.01); *G05F 3/30* (2013.01); *H03K 5/003* (2013.01)

(58) Field of Classification Search
None
See application file for complete search history.

(56) References Cited

U.S. PATENT DOCUMENTS

| | | | |
|---|---|---|---|
| 6,329,804 B1 * | 12/2001 | Mercer | G05F 3/30 323/314 |
| 6,466,081 B1 | 10/2002 | Eker | |
| 6,828,847 B1 | 12/2004 | Marinca | |
| 7,009,444 B1 | 3/2006 | Scott | |
| 9,804,614 B2 * | 10/2017 | Ji | G05F 1/468 |
| 2013/0069616 A1 * | 3/2013 | Venkiteswaran S | G05F 3/30 323/313 |
| 2014/0015509 A1 * | 1/2014 | Gupta | G05F 3/30 323/313 |

OTHER PUBLICATIONS

Wikipedia; "Bandgap voltage reference"; retrieved from the internet https://en.wikipedia.org/wiki/Bandgap_voltage_reference ; 3 pages (Sep. 21, 2017).

* cited by examiner

*Primary Examiner* — Jeffrey Gblende (57) ABSTRACT

One example discloses a voltage reference, including: a bandgap circuit core having a first intermediate bandgap voltage output, a second intermediate bandgap voltage output, and a bandgap voltage reference output; an amplifier having a first input, a second input, an input offset, an output, and an input_offset_trim; a trim controller; a switch matrix coupled between the bandgap circuit, the amplifier and the trim controller; wherein the switch matrix has a functional configuration and a calibration configuration; wherein in the functional configuration of the switch matrix, the first intermediate bandgap voltage output is coupled to the first input of the amplifier and the second intermediate bandgap voltage output is coupled to the second input of the amplifier; and wherein in response to the calibration configuration of the switch matrix, the trim controller is coupled to adjust the input offset of the amplifier using the input_offset_trim.

18 Claims, 5 Drawing Sheets

BANDGAP VOLTAGE REFERENCE

The present specification relates to systems, methods, apparatuses, devices, articles of manufacture and instructions for bandgap voltage references.

SUMMARY

According to an example embodiment, a voltage reference, comprising: a bandgap circuit core having a first intermediate bandgap voltage output, a second intermediate bandgap voltage output, and a bandgap voltage reference output; an amplifier having a first input, a second input, an input offset, an output, and an input_offset_trim; a trim controller; a switch matrix coupled between the bandgap circuit, the amplifier and the trim controller; wherein the switch matrix has a functional configuration and a calibration configuration; wherein in the functional configuration of the switch matrix, the first intermediate bandgap voltage output is coupled to the first input of the amplifier and the second intermediate bandgap voltage output is coupled to the second input of the amplifier; and wherein in response to the calibration configuration of the switch matrix, the trim controller is coupled to adjust the input offset of the amplifier using the input_offset_trim.

In another example embodiment, the switch matrix is configured to be in either the functional configuration or the calibration configuration during operation of the voltage reference.

In another example embodiment, the switch matrix is configured to add a delay between switching between the functional configuration and the calibration configuration.

In another example embodiment, in response to the functional configuration of the switch matrix, the trim controller is configured to keep the input_offset_trim of the amplifier at a fixed value.

In another example embodiment, in the calibration configuration of the switch matrix, either the first intermediate bandgap voltage output is uncoupled from the first input of the amplifier, or the second intermediate bandgap voltage output is uncoupled from the second input of the amplifier.

In another example embodiment, the trim controller is configured to minimize the input offset of the amplifier using the input_offset_trim.

In another example embodiment, further comprising an ambient temperature input; wherein the trim controller is configured to set the switch matrix to the calibration configuration in response to a temperature value on the ambient temperature input.

In another example embodiment, the trim controller is configured to control the switch matrix.

In another example embodiment, the trim controller is configured to set the switch matrix to the functional configuration in response to a first time signal and set the switch matrix to the calibration configuration in response to a second time signal.

In another example embodiment, the amplifier is a differential amplifier; wherein in the calibration configuration, the first and second inputs to the amplifier are coupled together; and wherein the trim controller is configured to stop adjusting the input_offset_trim of the amplifier in response to an output signal change from the differential amplifier.

In another example embodiment, in the calibration configuration, the trim controller is configured to ramp the input_offset_trim of the amplifier.

In another example embodiment, further comprising, a capacitor coupled to the bandgap voltage reference output; and an additional switch coupled between the capacitor and the bandgap circuit core; wherein the capacitor is configured to store a voltage on the bandgap voltage reference output; and wherein the additional switch is configured to isolate the bandgap circuit core from the bandgap voltage reference output when the switch matrix is in the calibration configuration.

In another example embodiment, the amplifier is a first amplifier and the input_offset_trim is a first input_offset_trim; further comprising, a second amplifier having a first input, a second input, an input offset, an output, and a second input_offset_trim; wherein the switch matrix is also coupled between the bandgap circuit, the second amplifier and the trim controller; wherein in the functional configuration of the switch matrix, the first intermediate bandgap voltage output is coupled to the first input of the first amplifier and the second intermediate bandgap voltage output is coupled to the second input of the first amplifier; and the trim controller is coupled to adjust the input offset of the second amplifier using the second input_offset_trim In another example embodiment, in the calibration configuration of the switch matrix, the first intermediate bandgap voltage output is coupled to the first input of the second amplifier and the second intermediate bandgap voltage output is coupled to the second input of the second amplifier; and the trim controller is coupled to adjust the input offset of the first amplifier using the first input_offset_trim.

In another example embodiment, at least one of the first and second amplifiers is configured to be coupled to the bandgap voltage reference output during operation of the voltage reference.

In another example embodiment, both of the first and second amplifiers are not coupled to the bandgap voltage reference output during operation of the voltage reference.

In another example embodiment, the amplifier is a CMOS amplifier.

According to an example embodiment, voltage reference, comprising: a bandgap circuit core having a first intermediate bandgap voltage output, a second intermediate bandgap voltage output, and a bandgap voltage reference output; a first amplifier having a first input, a second input, an input offset, an output, and an first input_offset_trim; a trim controller; a switch matrix coupled between the bandgap circuit, the amplifier and the trim controller; wherein the switch matrix has a functional configuration and a calibration configuration; wherein in the functional configuration of the switch matrix, the first intermediate bandgap voltage output is coupled to the first input of the first amplifier and the second intermediate bandgap voltage output is coupled to the second input of the first amplifier; and wherein in response to the calibration configuration of the switch matrix, the trim controller is coupled to adjust the input offset of the first amplifier using the first input_offset_trim; a second amplifier having a first input, a second input, an input offset, an output, and a second input_offset_trim; wherein the switch matrix is also coupled between the bandgap circuit, the second amplifier and the trim controller; wherein in the functional configuration of the switch matrix, the first intermediate bandgap voltage output is coupled to the first input of the first amplifier and the second intermediate bandgap voltage output is coupled to the second input of the first amplifier; and the trim controller is coupled to adjust the input offset of the second amplifier using the second input_offset_trim.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Bandgap voltage references are ideally temperature, power supply, and loading independent voltage references used in many integrated circuits to generate a fixed reference voltage. Bandgap voltage references typically generate an output voltage around 1.25 V.

Bandgap voltage references monitor a voltage difference between two p-n junctions (e.g. diodes), operated at different current densities. A difference voltage between two diodes having different size can be very temperature dependent and behave as VT*ln(ratio) and is proportional to absolute temperature (ptat). However, this ptat voltage can then be used to generate a ptat current which in turn is forced through the diodes. The diode forward voltage has a negative temperature coefficient at constant current. By applying a ptat current to a diode AND adding an additional ptat voltage (via R1 and or R2) a bandgap voltages can be created with zero temperature coefficient.

In some example embodiments, an amplifier in a bandgap voltage reference is trimmed to a predetermined output voltage during final test at a fixed temperature. However, offset in the amplifier is left untrimmed and hence, package stress induced changes in the amplifier's input offset, and variations in temperature, may shift the bandgap voltage output. This can reduce a circuit's precision when using such voltage references.

Techniques such as offset nulling with the aid of storage capacitors or chopping techniques such as chopping present different auto-zero approaches. Other approaches may use a bandgap with a single amplifier using chopping. Chopping involves up-mixing and down-mixing of analog signal lines circumventing the effect of offset. Often this injects unwanted spurious noise into the bandgap.

Now discussed are example embodiments that enable a bandgap-based voltage reference to be periodically or sporadically trimmed during operation. In one example, circuits for cancelling offset in a CMOS amplifiers commonly used in bandgaps. In a CMOS amplifier stage, input referred voltage offsets may occur due to mismatch of components. This mismatch originates from intrinsic offset due to process variations, but also from stress related factors such as package stress.

The intrinsic parameter mismatch can often be removed by trimming in the factory at a specific (room) temperature. However, package stress related offset can require trimming versus temperature. Instead of a single trim, multi temperature trim or continuous trim is required. Trimming at multiple temperatures in the factory is often time consuming and hence rather expensive.

The circuits described herein present a form of automated trimming. In one example embodiment, an automated trimming algorithm alternately trims at least two offset trimmable amplifiers. While one amplifier is in use, another amplifier is automatically being trimmed and vice versa. Trimming can be programmed in discrete steps where the trim algorithm attempts to find a best amplifier trim for minimal offset. By using two or more amplifiers, at least one of the amplifiers is always available for the bandgap function during circuit operation, thereby maintaining a constant bandgap voltage over temperature, package stress and other variables that can otherwise alter the bandgap voltage output.

Figure 1:
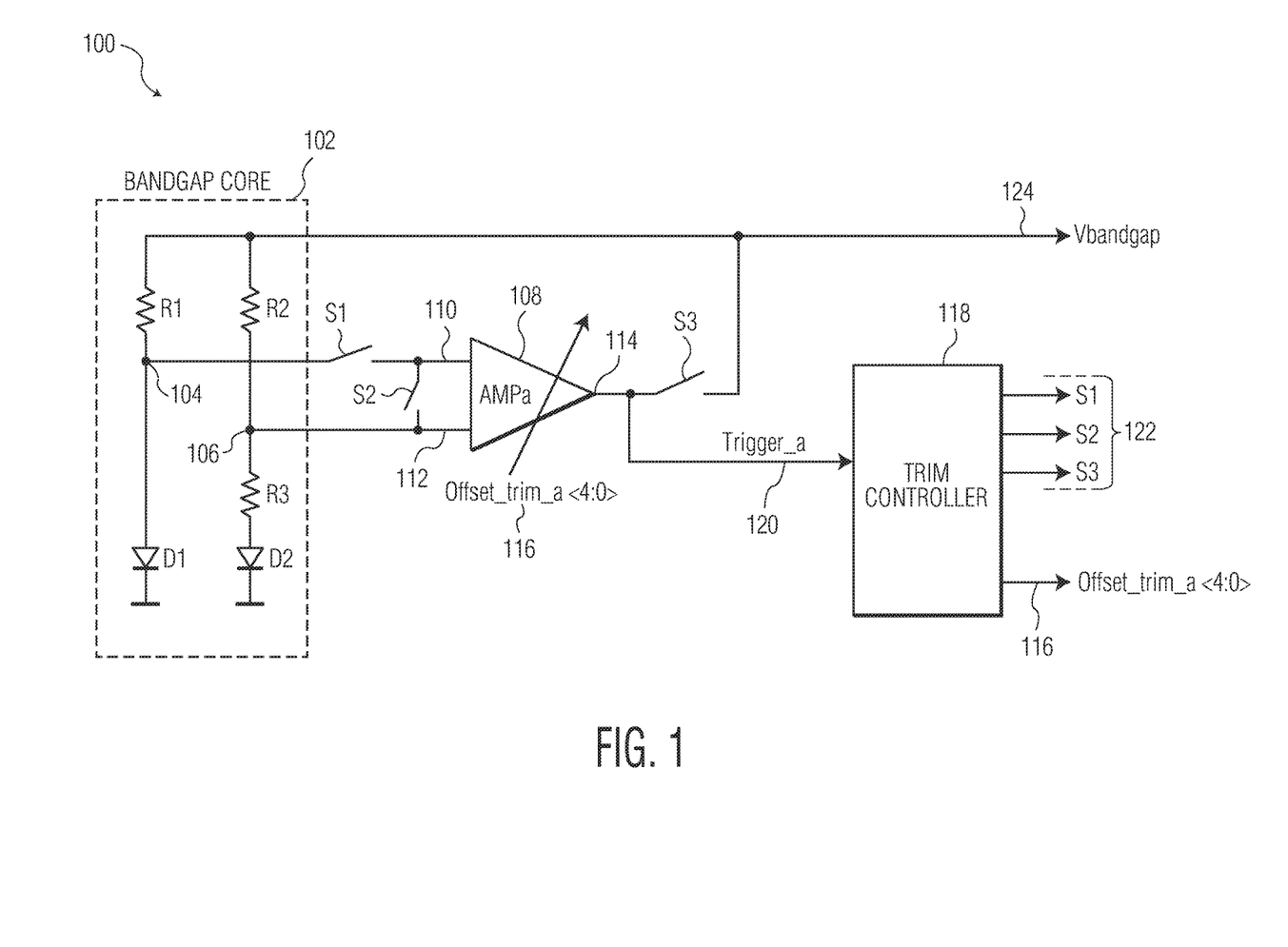
FIG. 1 is a first example of a bandgap-based voltage reference.

FIG. 1 is a first example 100 of a bandgap-based voltage reference. The first example bandgap-based voltage reference 100 includes a bandgap circuit core 102, an amplifier Ampa 108, a switch matrix (S1, S2, S3), a trim controller 118, and a bandgap voltage reference output (Vbandgap) 124 (e.g. nominally 1.23V, but will likely vary during calibration).

The bandgap circuit core 102 includes diodes D1, D2, resistors R1, R2, R3, a first intermediate bandgap voltage output 104, and a second intermediate bandgap voltage output 106. The bandgap reference voltage output 124 value depends on the selected attributes of the resistors (R1, R2, R3) and diodes (D1, D2).

If R1=R2, the bandgap reference voltage output 124 is defined as:

a. Vbandgap 124=V(D2)+Vt*Ln{A(D2)/A(D1)}*(R2+R3)/R3 or alternatively; and    b. Vbandgap 124=V(D1)+Vt*Ln{A(D2)/A(D1)} *(R1)/R3

Where:

a. V(D1) or V(D2) is the voltage across Diode D1 or D2 respectively;

b. Vt is the thermal voltage (also known as KT/q);

c. A(D2)/A(D1) is the ratio in area of diodes D2 and D1; and d. Ln is the natural log function

The amplifier Ampa 108 (e.g. a differential amplifier) includes a first input 110, a second input 112, an input offset (internal to Ampa, not shown), an output 114, and an input_offset_trim_a 116.

The trim controller 118 includes a Trigger_a input 120, and switch matrix control outputs (S1, S2, S3) 122. The trim controller 118 can alter the switch matrix control outputs (S1, S2, S3) to place the example voltage reference 100 in either a functional configuration (e.g. S1, S3 closed and S2 open) or a calibration configuration (e.g. S1, S3 open and S2 closed) as is discussed further below.

In the functional configuration of the switch matrix (S1, S2, S3), the first intermediate bandgap voltage output 104 is coupled to the first input 110 of the amplifier and the second intermediate bandgap voltage output 106 is coupled to the second input 112 of the amplifier. In amplifier Ampa's 108 functional configuration, S1 and S3 are closed while S2 is open.

In the calibration configuration of the switch matrix (S1, S2, S3), the trim controller 118 is coupled to adjust the input offset of the amplifier using the input_offset_trim_a 116. In this example embodiment, five bits are used for trimming, but any other number of bits can be used. In amplifier Ampa's 108 calibration configuration, S2 is closed while S1 and S3 are open.

The switch matrix (S1, S2, S3) is configured by the trim controller 118 to be in either the functional configuration or the calibration configuration during operation of the voltage reference. In one example embodiment, the switch matrix (S1, S2, S3) is configured to add a delay between switching between the functional configuration and the calibration configuration.

When in the functional configuration of the switch matrix (S1, S2, S3), the trim controller 118 is configured to keep the input_offset_trim_a 116 of the amplifier at a fixed value.

However, in the calibration configuration of the switch matrix (S1, S2, S3), either the first intermediate bandgap voltage output 104 or the second intermediate bandgap voltage output 106 are uncoupled from the amplifier 108 inputs 110, 112 and the trim controller 118 is configured to minimize the input offset of the amplifier using the input_offset_trim_a 116.

With the amplifier Ampa's 108 inputs connected to each other, the offset_trim for the amplifier Ampa 108 is then ramped from negative to positive. The output 114 switches (e.g. transitions) from negative to positive, or vise-versa, in response to ramping of the offset_trim_a 116. This output 114 switching is labeled as Trigger_a in the Figures.

Upon reaching an offset_trim where a minimum (e.g. minimal, or ideally zero) input offset occurs, the amplifier Ampa 108 output 114 will transition from a low (e.g. zero) voltage to a high (e.g. 1.8V) voltage. The trim controller 118 monitors the amplifier Ampa's 108 output voltage and latches the offset_trim code corresponding to the offset_trim where amplifier Ampa's 108 output voltage transition occurs. This offset_trim code for amplifier Ampa 108 is kept for later use during amplifier Ampa's 108 functional configuration phase.

Thus the input_offset_trim_a 116 to amplifier Ampa 108 reduces the amplifier's input_offset to a minimum so as not to introduce error into the first intermediate bandgap voltage 104 and second intermediate bandgap voltage 106 measurements.

With such trim codes, the amplifier Ampa 108 can be programmed to have either a positive or a negative offset. These positive or negative offset adds to intrinsic an offset error already present in the amplifier Ampa 108.

Figure 2:
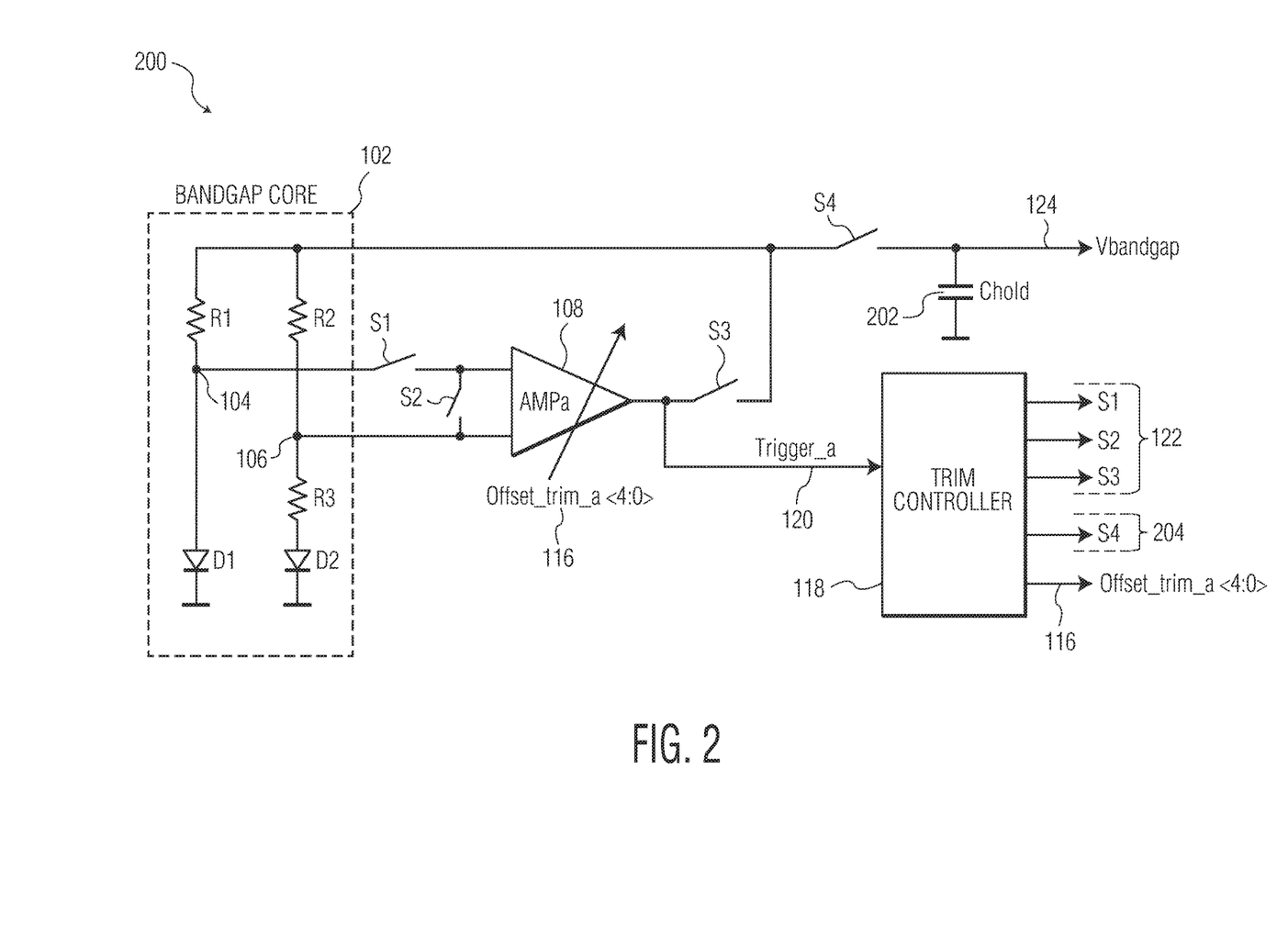
FIG. 2 is a second example of the bandgap-based voltage reference.

FIG. 2 is a second example 200 of the bandgap-based voltage reference. The second example voltage reference 200 adds a switch (S4), an output capacitor 202 (e.g. Chold), and a switch matrix control output (S4) 204 to the trim controller 118.

The output capacitor 202 is coupled to the bandgap voltage reference output (Vbandgap) 124, and the additional switch (e.g. S4) is coupled between the output capacitor 202 and the bandgap circuit core 102.

The output capacitor 202 is configured to store a voltage on the bandgap voltage reference output 124 while the amplifier Ampa 108 is being trimmed in the calibration configuration.

The additional switch S4 is configured to isolate the bandgap circuit core from the bandgap voltage reference output when the switch matrix (S1, S2, S3) is in the calibration configuration so as not to drain charge from the capacitor 202 and unduly lower Vbandgap 124.

Figure 3:
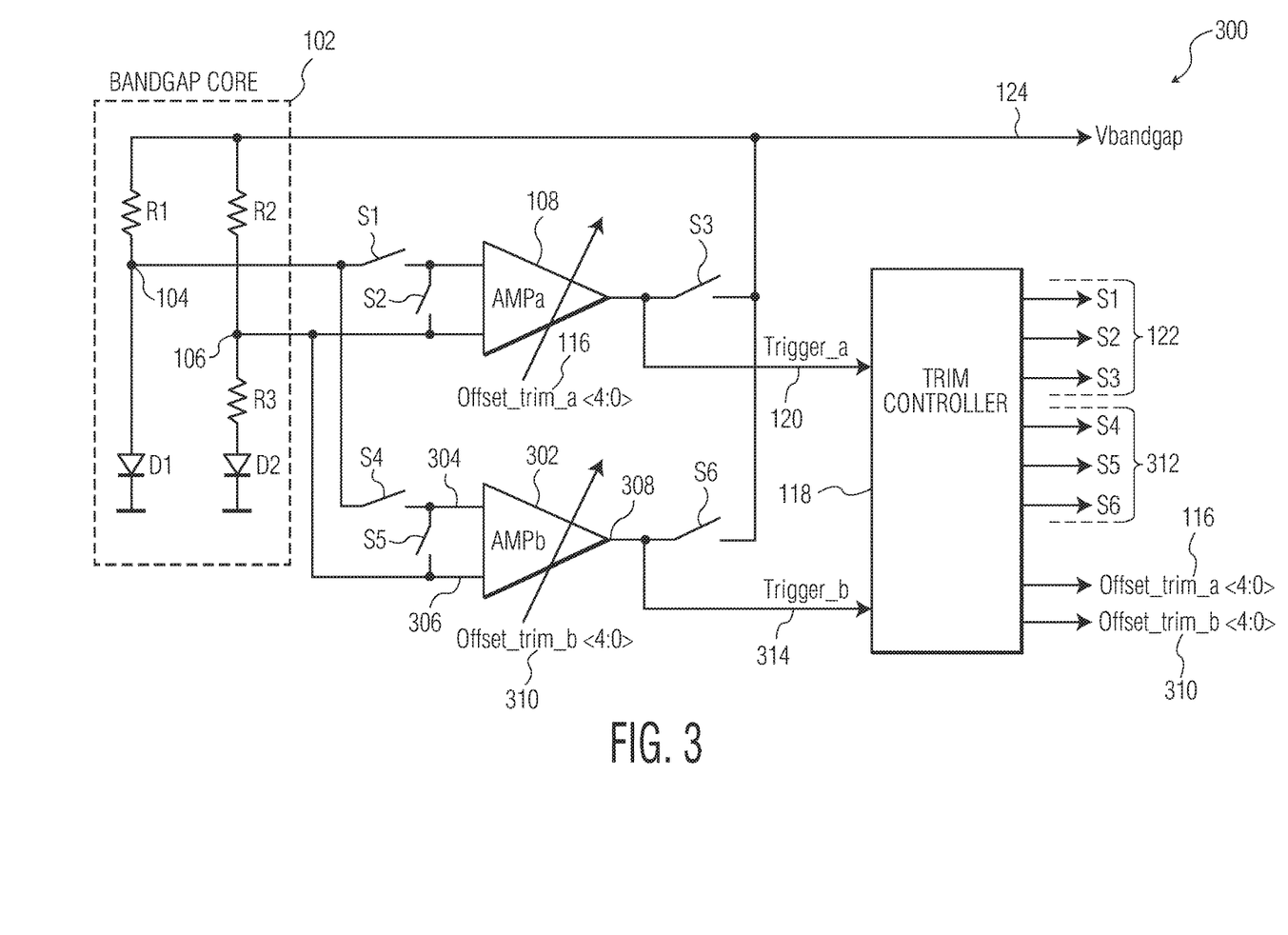
FIG. 3 is a third example of the bandgap-based voltage reference.

FIG. 3 is a third example 300 of the bandgap-based voltage reference. The third example voltage reference 300 adds, to the first example voltage reference 100, and a second switch matrix (S4, S5, S6).

The amplifier Ampb 302 includes a first input 304, a second input 306, an input offset (internal to Ampb, not shown), an output 308, and an input_offset_trim_b 310. The trim controller 118 includes a Trigger_b input 314, and switch matrix control outputs (S4, S5, S6) 312.

The switch matrix (S4, S5, S6) is coupled between the bandgap circuit core 102, the second amplifier 302 and the trim controller 118.

When amplifier Ampa 108 is in its functional configuration amplifier Ampb 302 is in its calibration configuration.

With the switches S1 thru S6, the trim controller 118 can set one amplifier to be in its functional configuration and thereby generating the bandgap voltage reference output, while the other amplifier is in a calibration configuration and being trimmed. With the trim bits offset_trim_a<4:0> and offset_trim_b<4:0>, amplifier Ampa 108 and amplifier Ampb 302 can be trimmed for minimal (e.g. zero) input offset respectively.

For example first, amplifier Ampa 108 in its calibration configuration is trimmed while amplifier Ampb 302 is in its functional configuration generating the bandgap voltage reference output. Then second, amplifier Ampb 302 is in its calibration configuration being trimmed while amplifier Ampa 108 is its functional configuration generating the bandgap voltage reference output.

In amplifier Ampa's 108 calibration configuration, S2, S4 and S6 are closed while S1, S3 and S5 are open. While in amplifier Ampa's 108 functional configuration, S1, S3 and S5 are closed while S2, S4 and S6 are open.

Thus by using two amplifiers, one amplifier is always available for the bandgap function while the other is being trimmed.

Figure 4:
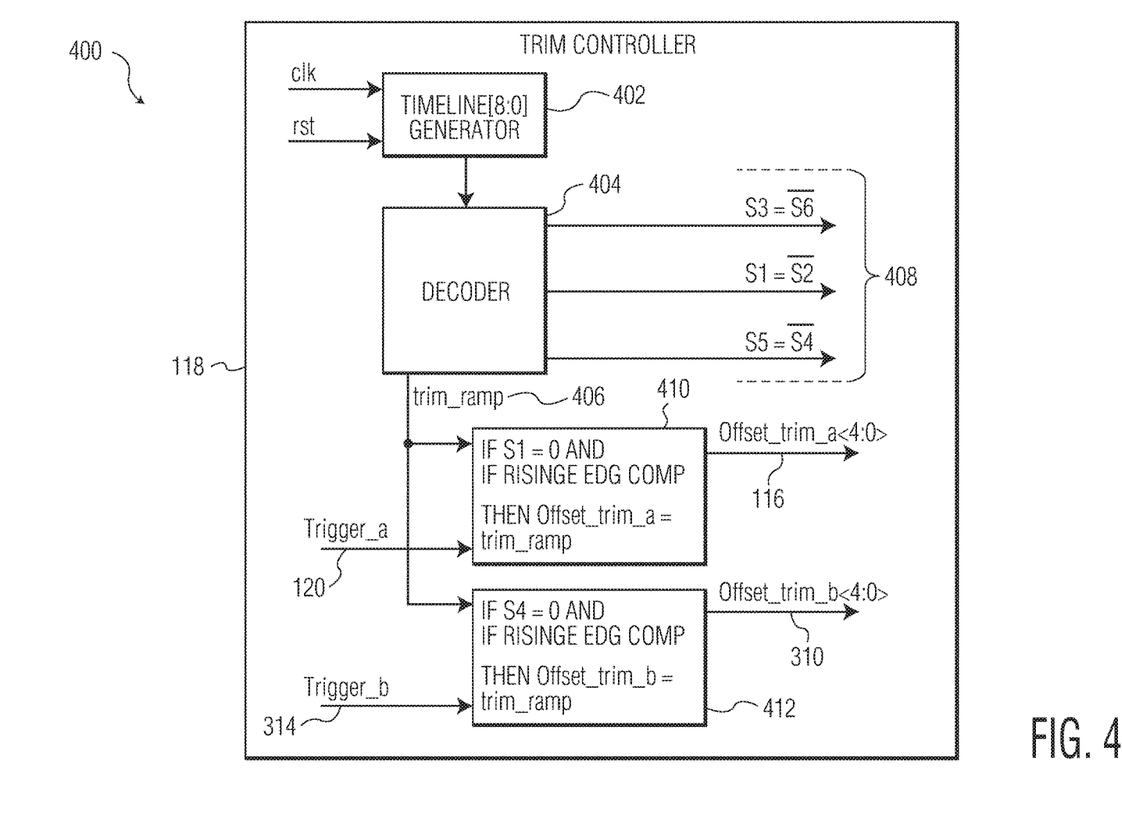
FIG. 4 is an example trim controller within the bandgap-based voltage reference.

FIG. 4 is an example 400 of the trim controller 118 within the bandgap-based voltage reference. The example 400 of the trim controller 118 includes a timeline generator 402, a decoder 404, and two sets of control logic 410, 412.

The timeline generator 402 determines when a next functional to calibration configuration cycle will occur. Such cycles can be periodic (e.g. based on a clock timing signals) or triggered by an external signal.

In one example embodiment, the external signal may be an ambient temperature signal. The timeline generator 402 monitors a temperature change from a last functional to calibration configuration cycle and if the temperature change exceeds a threshold change, the timeline generator 402 is configured to trigger another functional to calibration configuration cycle.

The decoder 404 controls the switch matrix control outputs (S1, S2, S3, S4, S5, S6) 408 and generates or passes a trim_ramp signal 406 to the control logic 410, 412.

In this example, when amplifier Ampa 108 is being calibrated (e.g. S1=0) then control logic 410 is configured to latch input_offset_trim_a 116 when Trigger_a input 120 transitions (e.g. rising edge). Similarly when amplifier Ampb 302 is being calibrated (e.g. S4=0) then control logic 412 is configured to latch input_offset_trim_b 310 when Trigger_b input 314 transitions (e.g. rising edge).

Figure 5:
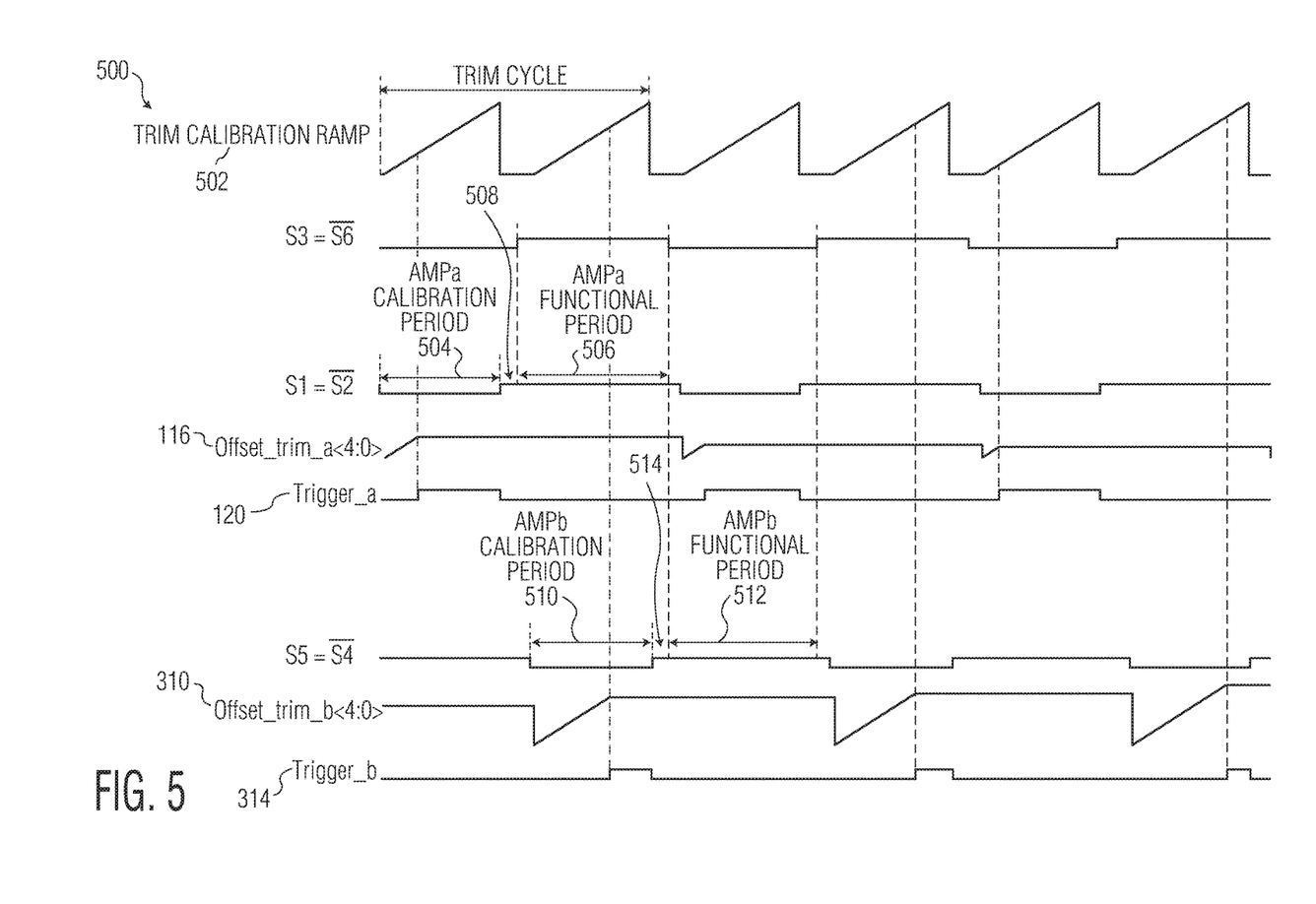
FIG. 5 is an example timing diagram for trimming the third example bandgap-based voltage reference.

FIG. 5 is an example timing diagram 500 for trimming the third example bandgap-based voltage reference. The example timing diagram 500 for trimming shows a timing calibration ramp 502, an amplifier Ampa calibration period 504, an amplifier Ampa functional period 506, an amplifier Ampa delay 508, an amplifier Ampb calibration period 510, an amplifier Ampb functional period 512, and an amplifier Ampb delay 514.

The Ampa delays 508, 514 between the calibration periods 504, 510 and the functional periods 506, 512 provides time for the amplifiers 108, 302 to settle after being trimmed. The Trigger_a 120 and Trigger_b 314 transitions can also be seen ending the amplifier Ampa calibration period 504 and the amplifier Ampb calibration period 510 respectively.

Various logic circuit, such as the trim controller 118, or other computational systems can host the instructions/operational steps discussed above. Such systems can include an input/output data interface, a processor, a storage device, and a non-transient machine-readable storage medium. The machine-readable storage medium includes the instructions which control how the processor receives input data and transforms the input data into output data, using data within the storage device. The machine-readable storage medium in an alternate example embodiment is a non-transient computer-readable storage medium. In other example embodiments the set of instructions described above can be implemented either using logic gates, application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A voltage reference, comprising:
   a bandgap circuit core having a first intermediate bandgap voltage output, a second intermediate bandgap voltage output, and a bandgap voltage reference output;
   an amplifier having a first input, a second input, an input offset, an output, and an input_offset_trim;
   a trim controller;
   a switch matrix coupled between the bandgap circuit, the amplifier and the trim controller;
   wherein the switch matrix has a functional configuration and a calibration configuration;
   wherein in the functional configuration of the switch matrix, the first intermediate bandgap voltage output is coupled to the first input of the amplifier and the second intermediate bandgap voltage output is coupled to the second input of the amplifier; and
   wherein in response to the calibration configuration of the switch matrix, the trim controller is coupled to adjust the input offset of the amplifier using the input_offset_trim.

2. The voltage reference of claim 1:
   wherein the switch matrix is configured to be in either the functional configuration or the calibration configuration during operation of the voltage reference.

3. The voltage reference of claim 1:
   wherein the switch matrix is configured to add a delay between switching between the functional configuration and the calibration configuration.

4. The voltage reference of claim 1:
   wherein in response to the functional configuration of the switch matrix, the trim controller is configured to keep the input_offset_trim of the amplifier at a fixed value.

5. The voltage reference of claim 1:
   wherein in the calibration configuration of the switch matrix, either the first intermediate bandgap voltage output is uncoupled from the first input of the amplifier, or the second intermediate bandgap voltage output is uncoupled from the second input of the amplifier.

6. The voltage reference of claim 1:
   wherein the trim controller is configured to minimize the input offset of the amplifier using the input_offset_trim.

7. The voltage reference of claim 1:
   further comprising an ambient temperature input;
   wherein the trim controller is configured to set the switch matrix to the calibration configuration in response to a temperature value on the ambient temperature input.

8. The voltage reference of claim 1:
   wherein the trim controller is configured to control the switch matrix.

9. The voltage reference of claim 1:
   wherein the trim controller is configured to set the switch matrix to the functional configuration in response to a first time signal and set the switch matrix to the calibration configuration in response to a second time signal.

10. The voltage reference of claim 1:
    wherein the amplifier is a differential amplifier;

wherein in the calibration configuration, the first and second inputs to the amplifier are coupled together; and wherein the trim controller is configured to stop adjusting the input_offset_trim of the amplifier in response to an output signal change from the differential amplifier.

11. The voltage reference of claim 1:

wherein in the calibration configuration, the trim controller is configured to ramp the input_offset_trim of the amplifier.

12. The voltage reference of claim 1:

further comprising,
- a capacitor coupled to the bandgap voltage reference output; and
- an additional switch coupled between the capacitor and the bandgap circuit core;

wherein the capacitor is configured to store a voltage on the bandgap voltage reference output; and wherein the additional switch is configured to isolate the bandgap circuit core from the bandgap voltage reference output when the switch matrix is in the calibration configuration.

13. The voltage reference of claim 1:

wherein the amplifier is a first amplifier and the input_offset_trim is a first input_offset_trim;

further comprising, a second amplifier having a first input, a second input, an input offset, an output, and a second input_offset_trim;

wherein the switch matrix is also coupled between the bandgap circuit, the second amplifier and the trim controller;

wherein in the functional configuration of the switch matrix,
- the first intermediate bandgap voltage output is coupled to the first input of the first amplifier and the second intermediate bandgap voltage output is coupled to the second input of the first amplifier; and
- the trim controller is coupled to adjust the input offset of the second amplifier using the second input_offset_trim.

14. The voltage reference of claim 13:

wherein in the calibration configuration of the switch matrix,
- the first intermediate bandgap voltage output is coupled to the first input of the second amplifier and the second intermediate bandgap voltage output is coupled to the second input of the second amplifier; and
- the trim controller is coupled to adjust the input offset of the first amplifier using the first input_offset_trim.

15. The voltage reference of claim 14:

wherein at least one of the first and second amplifiers is configured to be coupled to the bandgap voltage reference output during operation of the voltage reference.

16. The voltage reference of claim 14:

wherein both of the first and second amplifiers are not coupled to the bandgap voltage reference output during operation of the voltage reference.

17. The voltage reference of claim 1:

wherein the amplifier is a CMOS amplifier.

18. A voltage reference, comprising:

a bandgap circuit core having a first intermediate bandgap voltage output, a second intermediate bandgap voltage output, and a bandgap voltage reference output;

a first amplifier having a first input, a second input, an input offset, an output, and an first input_offset_trim;

a trim controller;

a switch matrix coupled between the bandgap circuit, the amplifier and the trim controller;

wherein the switch matrix has a functional configuration and a calibration configuration;

wherein in the functional configuration of the switch matrix,
- the first intermediate bandgap voltage output is coupled to the first input of the first amplifier; and
- the second intermediate bandgap voltage output is coupled to the second input of the first amplifier; and wherein in response to the calibration configuration of the switch matrix, the trim controller is coupled to adjust the input offset of the first amplifier using the first input_offset_trim;

a second amplifier having a first input, a second input, an input offset, an output, and a second input_offset_trim;

wherein the switch matrix is also coupled between the bandgap circuit, the second amplifier and the trim controller;

wherein in the functional configuration of the switch matrix,
- the first intermediate bandgap voltage output is coupled to the first input of the first amplifier and the second intermediate bandgap voltage output is coupled to the second input of the first amplifier; and
- the trim controller is coupled to adjust the input offset of the second amplifier using the second input_offset_trim.

* * * * *